United States Patent [19]

Lindenberger et al.

[11] Patent Number: 4,571,449

[45] Date of Patent: Feb. 18, 1986

[54] SHIELDED DOOR ASSEMBLY

[75] Inventors: James N. Lindenberger; Bert M. Christie, both of Culver City; Roy V. Johnson, San Fernando, all of Calif.

[73] Assignee: Dow Industries, Culver City, Calif.

[21] Appl. No.: 641,482

[22] Filed: Aug. 16, 1984

[51] Int. Cl.$^4$ ............................................. H05K 9/00
[52] U.S. Cl. .......................... 174/35 MS; 174/35 GC; 292/36
[58] Field of Search .......... 174/35 R, 35 GC, 35 MS; 219/10.55 D; 292/36; 49/35

[56] References Cited

U.S. PATENT DOCUMENTS

| | | | |
|---|---|---|---|
| 2,056,226 | 10/1936 | Mussey et al. | 292/36 X |
| 2,584,088 | 1/1952 | Floyd | 292/36 X |
| 3,055,969 | 9/1962 | Schaller, Jr. | 49/395 X |
| 3,437,735 | 4/1969 | Schaller, Jr. | 174/35 MS |
| 3,745,226 | 7/1973 | Nichols et al. | 174/35 MS |

FOREIGN PATENT DOCUMENTS 1179975  2/1970  United Kingdom .......... 174/35 GC

OTHER PUBLICATIONS

IBM Technical Disclosure Bulletin, Lockhart, Twin Flex Contact, vol. 13, No. 10, 3/71.

*Primary Examiner*—A. T. Grimley
*Assistant Examiner*—D. A. Tone
*Attorney, Agent, or Firm*—Shlesinger, Arkwright, Garvey & Fado

[57] ABSTRACT

A shielded door assembly for a generally rectangular opening in the electrically conductive wall of a grounded building has an electrically conductive frame secured to the wall along three of the sides of the opening. A tubular frame is secured to the first frame along the three sides thereof. An electrically conductive threshold having a non-interrupted contact surface is secured to the tubular frame at the remaining side of the opening. An electrically conductive door stop is secured to a first edge of said tubular frame and extends outwardly therefrom and cooperates with the tubular frame and the first frame for defining a pocket. An electrically conductive tubular door rim is pivotally secured to said first frame and is adapted for pivoting between an open and a closed position. The door includes a first surface thereof adjacent the threshold and a plurality of electrically conductive resilient spring means are secured to the first surface for establishing electrical connection between the door and the threshold. A plurality of electrically conductive resilient springs connect the door to the pocket for thereby further facilitating electrical communication between the door and the building. A locking assembly is also provided for maintaining the door in the closed position.

23 Claims, 9 Drawing Figures

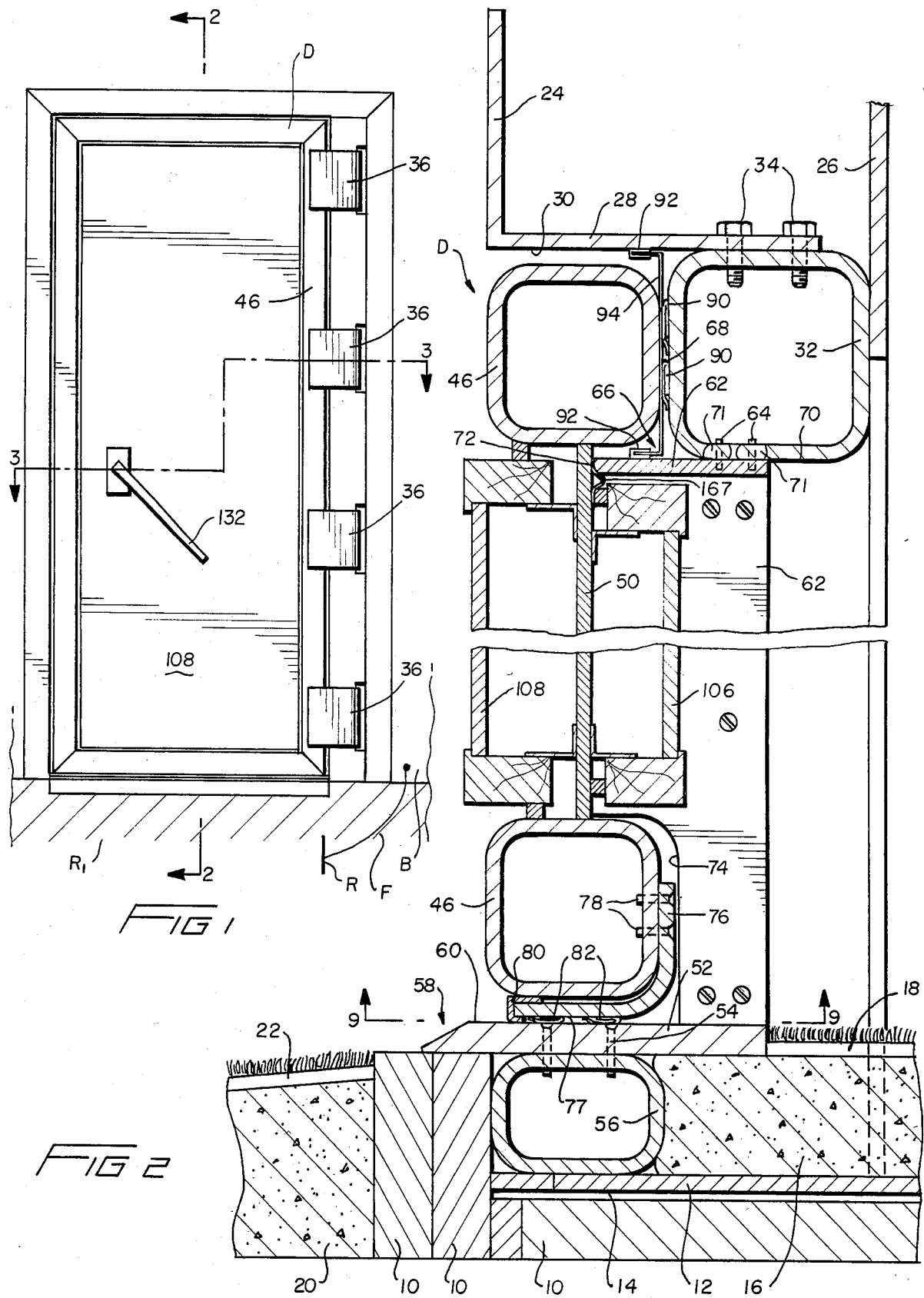

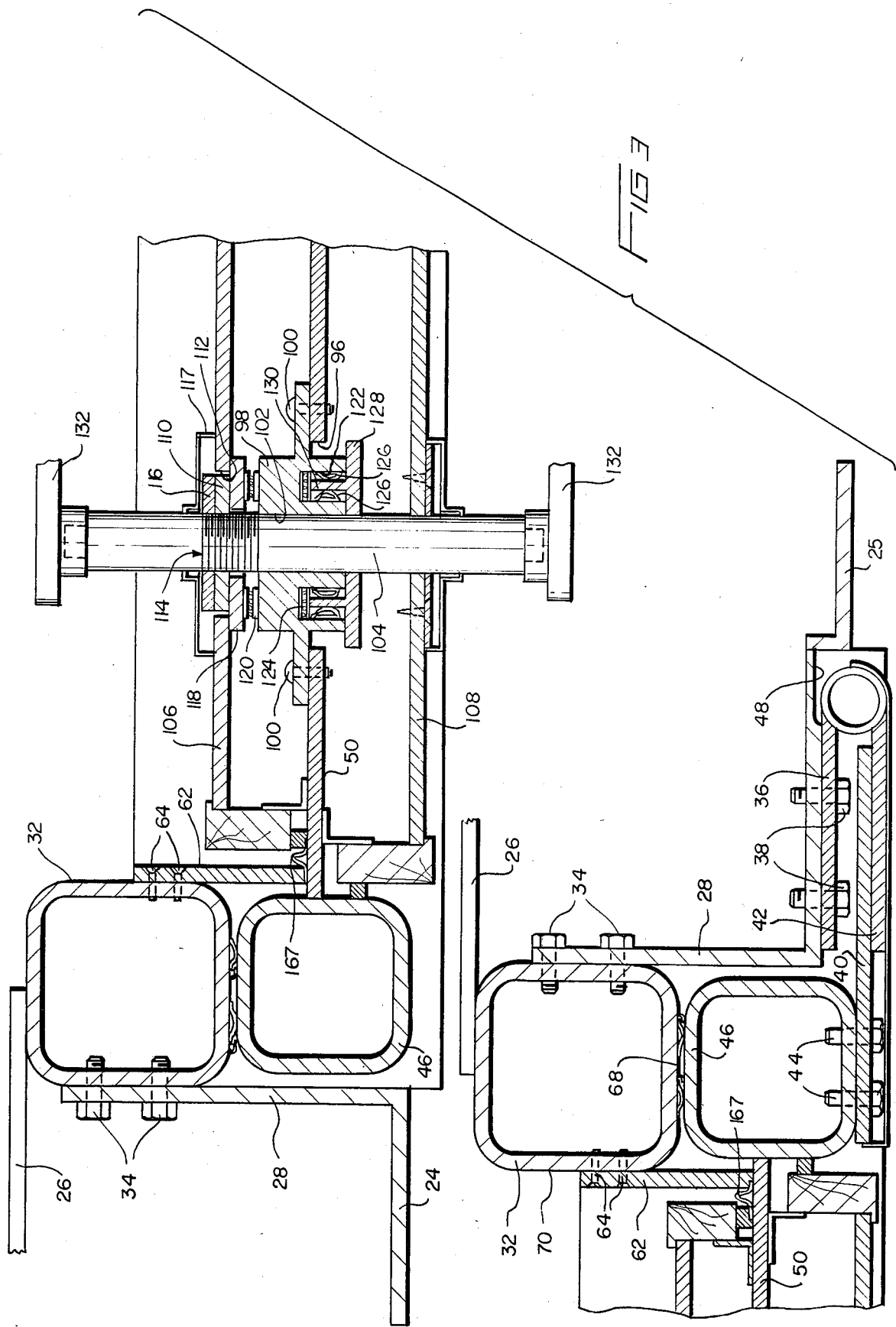

SHIELDED DOOR ASSEMBLY

BACKGROUND OF THE INVENTION

Many types of electronic and electrical equipment are sensitive to, and may be adversely affected by, electrical disturbances caused by magnetic fields, electric fields and plane wave fields. The increasing sophistication of the electrical and electronic apparatus necessitates emplacement in a facility which is grounded and which substantially prevents entrance of the spurious fields. The facility must, however, be suitable for human occupation with the result that doors and other entranceways must be provided both for access by personnel and various equipment. Similarly, building facilities, such as electric power, water, etc. must also be provided. The accessways, as well as the various facilities, usually require an opening in the building with the result that any opening wll permit the above-described fields to penetrate the building and thereby affect the equipment. Consequently, a system for securing the accessways and preventing the transmission therethrough of fields in desirable.

The electronic and electrical equipment located in the building is also responsible for the generation of fields and electrical signals. The equipment is, frequently, utilized under extremely secretive conditions and containment of the apparatus generated fields is required in order to prevent interdiction and interpretation of the fields by unwanted persons. The apparatus generated fields may be interpreted, with the result that the secretive work being carried out may be compromised. For this reason, the system for securing the accessways must also prevent the transmission of the apparatus generated fields throught the accessways.

Prior art sealing assemblies have utilized various electrically conductive sealing mechanisms for securing the accessways. These sealing mechanisms have a general drawback that the door which closes the accessway requires a bottom sealing assembly having substantial height. This bottom assembly necessitates the utilization of ramps on either side of the door in order to permit the movement of equipment and personnel through the door. The ramps are generally displaceable from a lower to an upper position with the result that passage through the accessway is very slow, particularly when a double accessway system is utilized. An additional problem is the fact that heavy equipment frequently bends or otherwise distorts the bottom sealing assembly and therefore adversely affects the security of the facility.

Sliding door assemblies have also been utilized for closing the accessways. The sliding doors also have the undesirable feature of the high bottom step. An additional problem with sliding doors is the need for some means of maintaining electrical connection between the door and the frame assembly. While electrically conductive springs and other such contact assemblies have been utilized in the above-described doors, such spring contact assemblies are frequently inappropriate with sliding doors.

A particular problem with both sliding doors, as well as conventional doors, is the necessity of a locking assembly. The door which closes the accessway must be capable of being easily opened and closed repeatedly, without adversely affecting the field shielding integrity of the door. Similarly, local building regulations require that the door be capable of being opened or closed with the exertion of minimal amounts of force, such as 20 lbs. The local building requirements also apply to the raised step because such a raised step may deny access to the building by handicapped persons. Consequently, local building regulations significantly impact the design of the door and its sealing assembly.

Schaller, U.S. Pat. No. 3,437,735, discloses a door construction for a shielded room. The door construction of Schaller discloses the utilization of leaf spring contact fingers around the periphery of the door or the door jamb. The door construction of Schaller, however, discloses the large raised step which has been found to be objectionable. Additionally, Schaller does not disclose the locking system for the door. A further problem with the Schaller design is the fact that the contact springs are made operational due to the pressure caused by closing of the door. One skilled in the art can appreciate that the greater the number of springs utilized, then the greater the amount of pressure required to close the door.

Based upon the above, one skilled in the art will appreciate that a new and unique shielded door assembly which conforms to local building regulations and which significantly inhibits the transmission of disruptive fields and signals through the accessway is advantageous. The disclosed invention provides a shielded door assembly utilizing both pressure operated and sliding contact spring assemblies to minimize the force required to open or close the door. Similarly, the high step has been eliminated and the field shielding integrity of the door has been improved through the utilization of parallel rows of leaf spring contact assemblies. Additionally, the door latching mechanism is disposed forwardly of the door panel and spring contact assemblies to thereby minimize the need for apertures in the door and the door frame, which would otherwise necessitate additional shielding protection.

OBJECTS AND SUMMARY OF THE INVENTION

The primary object of the disclosed invention is to provide a shielded door assembly overcoming the disadvantages of prior art assemblies while significantly improving the field shielding integrity of the door.

A further object of the invention is to provide a door locking assembly which permits opening and sealing of the accessway by the door through the utilization of minimal amounts of force.

Yet another object of the disclosed invention is to provide a shielded door assembly which does not require the utilization of high step.

An additional object is to provide a contact assembly which scours the contact threshold but which is also easily removable to facilitate repair and inspection.

Another object is to provide two sets of contact spring assemblies, the sets being transverse of each other to thereby minimize the force required to close and open the door.

The disclosed shielded door assembly may be particularly advantageously utilized with a generally rectangular opening in the electrically conductive wall of a grounded building. A first electrically conductive frame is secured to the wall along three sides of the opening. An electrically conductive frame is secured to the first frame along the three sides of the opening and an electrically conductive threshold having a non-interrupted contact surface is secured to the tubular frame or electrically conductive floor at the bottom side of the opening. An electrically conductive door stop is secured to a first edge of the frame and extends outwardly therefrom along the perimeter thereof and cooperates with the frame and the first frame for defining a pocket. An electrically conductive door is pivotally mounted to the first frame and is adapted for pivoting between an open and a closed position. Electrically conductive bent copper spring strips are secured to the interior face of the door along the two jamb edges and along the top head edge to assure positive contact between the door and the frame stops when the door is in the closed and latched position. A plurality of electrically conductive resilient contact springs are secured to the frame in the pocket above described and are adapted for electrically connecting the door with the frame. Similarly, a plurality of electrically conductive resilient contact springs are secured to a removable clip which is in turn secured to the bottom edge of the door and the contact springs are thereby adapted for sliding wiping engagement with the threshold for further establishing electrical connection between the door and the frame. A locking assembly is connected to the door on the frontal surface thereof and includes a plurality of contoured shafts whch cooperate with a plurality of angularly disposed ramps positioned in the frame. Lateral displacement of the shafts causes the forward angled portion thereof to slide along the ramp and thereby press the door into the closed orientation. The ramps are, preferably, made of oiled bronze to facilitate low friction sliding.

One skilled in the art will appreciate that the above-described shielded door assembly is uniquely adapted for advantageously sealing the accessway of a secure building while simultaneously preventing the transmission of electromagnetic field effects through the accessway. The door assembly may be easily opened and closed repeatedly while still maintaining the field integrity necessary while the door is closed.

These and other objects and advantages of the invention will be readily apparent in view of the following description and drawings of the above-described invention.

DESCRIPTION OF THE DRAWINGS

The above and other objects and advantages and novel features of the present invention will become apparent from the following detailed description of the preferred embodiment of the invention illustrated in the accompanying drawings, wherein:

FIG. 1 is a front elevational view disclosing the shielded door assembly of the invention mounted and in the closed position;

FIG. 2 is a fragmentary cross-sectional view taken along the section 2—2 of FIG. 1 and viewed in the direction of the arrows;

FIG. 3 is a fragmentary cross-sectional view taken along the section 3—3 of FIG. 1 and viewed in the direction of the arrows;

DESCRIPTION OF THE INVENTION

Figure 9:
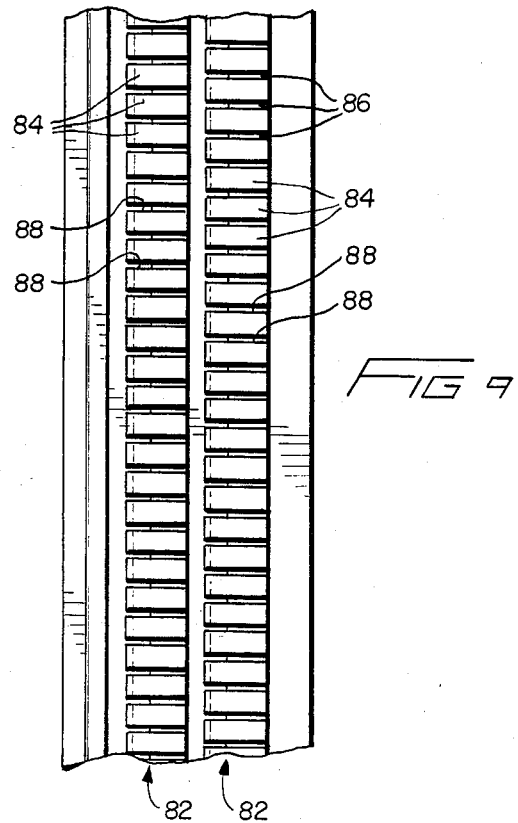

As best shown in FIGS. 1 and 2, door assembly D is pivotally mounted to building B. Building B has a foundation F of conventional design and construction. A plurality of polypropylene sheets 10 are disposed around foundation F. Sheets 10 are sealed, such as by heat sealing, at their edges to thereby provide a continuous polypropylene enclosure for foundation F. Steel shielding 12 is disposed above ceramic insulation blanket 14 which rests upon polypropylene sheets 10. The polypropylene sheets 10, in conjunction with the steel shielding 12 and the ceramic insulation blanket 14, serve to isolate the foundation F from the surrounding terrain to thereby further insure the integrity of building B by preventing uncontrolled tapping or interdiction of signals emanating from building B. Concrete 16 or other suitable fill material is disposed above shielding 12 and is adapated for providing a level floor for building B. A floor finish 18, such as carpeting, tile or the like, is disposed above concrete 16 in order to enhance the attractiveness of the building B.

Concrete walkway 20 is disposed forwardly of building B and is covered with a floor finish 22 which is similar to floor finish 18. Walkway 20 leads to door assembly D and is of sufficient size and strength to permit equipment and personnel to access the building B through door assembly D.

As best shown in FIGS. 2 and 3, building B includes a trim or fin member 24 and an interior wall member 26. First frame member 28 which is, preferably, integral with trim member 24, is a right angle leg extending inwardly and adapted for providing a first frame assembly for generally rectangular aperture 30. It can be noted that outer angle frame 28 extends around three sides of the aperture 30 with only the bottom side thereof, adjacent to the floor finish 18 left open. The first frame 28 extends inwardly a substantial distance and terminates, preferably, just proximate inner wall 26. First frame 28 and interior wall 26 are both manufactured from electrically conductive material, such as steel, and are connected to a dedicated grounding system R and insulated from foundation F so that spurious field signals impinging on either first frame 28, trim 24 or interior wall 26 will be conducted to the single point ground R. This configuration assures that the impinging signals will either not pass into the interior of building B or will not exit from the building B. The foundation F will be grounded separately by grounding system R, in a manner well known.

Generally rectangular electrically conductive tubular frame 32 is secured by bolts 34 to first frame 28. Frame 32, which may be steel or the like, has one edge thereof secured to interior wall 26 by welding or the like, although other fastening means are well know in the art. Tubular frame 32 extends around first frame 28 and therby provides a contact door frame. It can be noted that tubular frame 32 is, preferably, square in cross section and is sized such that a significant open portion extends forwardly of first frame 28 in front of tubular frame 32, for reasons to be explained herein.

As best shown in FIGS. 1 and 3, hinges 36 are secured by bolts 38 to first frame 28. Flap extension 40 is secured by welding or the like to hinge portion 42 and extends parallel to first frame 28. Flap extension 40 is secured by bolts 44 to tubular door rim 46. The hinged side of first frame member 28 includes, preferably, recessed portion 48, which may continue and include an angle 25 to match and align with exterior legs of the latch side and the top side of first frame 28 to form a surrounding trim. Hinge 36 is secured to bolts 38 to first frame 28. This arrangement assures that the hinge portion 42 is closely aligned with first frame 28 and thereby serves to promote a smooth and continuous framed appearance to the exterior of building B.

As best shown in FIGS. 1-6, tubular door rim 46 extends around all four sides of accessway or aperture 30. Door rim 46 is manufactured from an electrically conductive material, such as steel, and is positioned, when in the closed position, such that door rim 46 is nearly contiguous with tubular frame 32. Rim 46 is, preferably, manufactured from square tubing so as to approximate the shape of tubular frame 32. Electrically conductive panel member 50 is secured by welding or the like to tubular rim 46 around its periphery and thereby serves to close opening 30. It can be noted in FIG. 2 that panel member 50 is mounted approximately equidistant from the inner and outer edges of tubular rim 46. The panel 50 is, therefore, parallel to interior wall member 26 and is generally transverse of the interior of first frame 28. Panel 50 is secured by continuous welding or the like around its periphery to tubular rim 46 which thereby eliminates the possibility of field signals leaking through any gaps disposed between panel 50 and tubular rim 46.

As best shown in FIGS. 2 and 3, copper threshold 52 is secured to bolts 54 to tubing 56 which is secured by continuous welding to shielding 12. Threshold 52 extends at least between the two parallel leg extensions of first frame 28 disposed on the two lengthwise sides of aperture 30 and the threshold 52 is secured to the legs 28 and to the bottom of frame 32. Threshold 52 is in electrical communication with frame 32 and leg extensions of first frame 28 which thereby prevents field signals from leaking through and below door assembly D. While the threshold 52 is disclosed as being made of copper, one skilled in the art can appreciate that other electrically conductive materials are know and suitable for this purpose. It can be noted in FIG. 2 that threshold 52 has a tapered portion 58 sloped toward floor finish 22 and provides, therefore, a ramp to facilitate wheeled carriages across threshold 52. Threshold 52 also has a smooth continuous non-interrupted top contact surface 60 which extends from tapered portion 58 to substantially midway tubular frame 32. It can be appreciated that threshold 52 has a very low height or elevation in order to comply with the local building regulations. The height of threshold 52 is such that wheeled vehicles, such as wheelchairs and the like easily roll across threshold 52 because of ramp 58 and thereby the need for ramps of prior art doors is eliminated. Furthermore, the high step is also eliminated. Additionally, threshold 52 is of sturdy construction and will not be bent or easily damage by wheeled, heavy carriages.

As best shown in FIGS. 2 and 3, door stop 62 is secured by bolts 64 to a first edge or side of tubular frame 32. Door stop 62, which is electrically conductive steel or the like, extends outwardly away from tubular frame 32 parallel to the inward leg extension of first frame 28. Door stop 62 cooperates with tubular frame 32 and extension 28 to thereby define a pocket 66. Pocket 66 includes door stop 62, the inward leg extension of first frame 28 and a second edge 68 of tubular frame 32. Second edge 68 is transverse of first edge 70 to which door stop 62 is bolted. Preferably, bolts 64 are disposed in slots 71 in order to facilitate inward and outward adjustment of door stop 62 into alignment with door assembly D. Bent copper spring strips 167 are secured to door panel 50 continuously inside both vertical sides of door panel 50 and along the top of door panel 50 and make first contact with door stops 62 when door assembly D is closed. It can be noted in FIG. 2 that door assembly D, when in the closed position which is illustrated, is positioned such that outer edge 72 of door stop 62 engages spring strips 167 which are fastened to panel 50 along the inner surface thereof and thereby establishes electrical connection between panel 50 and building B.

FIG. 2 discloses that the two side portions of door stop 62 each include a cut-away or contoured recess 74 at the bottom portion thereof in order to permit the lower end of tubular rim 46 which extends parallel to threshold 52 to be received therein. It can be appreciated that the utilization of a door stop 62 along the bottom portion of aperture 30 parallel to and above bottom tubular rim 46 would necessitate the utilization of ramps or steps in order to access building B. The recesses 74 on either of lengthwise sides of access way 30 allow the door assembly D to close. Electrical connection and blocking of field signal transmission is, however, accomplished at the threshold 52 in a manner to be described which differs from the contact at the sides and top of door assembly D when door stop outer edge 72 engages spring strips 167 and panel 50.

As best shown in FIGS. 2 and 9, angle clip 76 is secured to the bottom member of tubular rim 46 by bolts 78. Clip 76 has a generally U-shaped terminal portion 80 which is secured either to rim 46 or, preferably, to clip 76. The terminal portion 80 scrapes contact surface 60 of threshold 52 and thereby removes any debris while at the same time making positive electrical contact with threshold 52. Contact spring assemblies 82 are disposed in two parallel rows, as best shown in FIG. 9, along the bottom surface 77 of angle clip 76. The contact spring assemblies 82 are, preferably, manufactured from berrylium copper and are similar to those disclosed in U.S. Pat. No. 3,540,095. The spring assemblies 82 and the clip 76 are conductive with the result that the door assembly D, when in the closed position, is in electrical connection with the threshold 52 with the result that the door assembly D is in electrical communication with the building B throughout the periphery of the door assembly D. This prevents the transmission of field signals through the door or around the periphery thereof.

It can be noted in FIG. 9 that each row of the contact spring assemblies 82 is comprised of a plurality of berrylium copper clips 84 with each of the clips connected to adjacent clips 84 by tabs 86. The tabs 86 extend transversely beyond each of the clips 84 with the result that slots 88 are disposed adjacent each of the clips 84. It can be noted in FIG. 9 that the slots 88 of each of the rows of assemblies 82 are offset from the slots 88 of the adjacent row 82 with the result that the slots 88 are always aligned with the solid portion of one of the clips 84.

This configuration prevents any field signals from passing through the slots 88, and thereby serves to further ground the door assembly D.

One skilled in the art will appreciate that the clips 84 contact contact surface 60 through a sliding wiping engagement generated by the pivoting of the door D on the hinges 36. This sliding wiping engagement with contact surface 60 requires less opening and closing force than if the contact springs 82 had been otherwise disposed, as in prior art door assemblies. The reduced opening and closing force is important if local building regulations are to be compiled with.

A particularly advantageous feature of the clip 76 to which the springs 82 are secured is the fact that the clip 76 may be removed from the rim 46 to thereby permit inspection of and replacement of the spring assemblies 82. This feature, in cooperation with the cleaning action of the terminal portion 80, assures that the spring assemblies 82 are always in electrical connection with the threshold 52 when the door D is in the closed position.

Figure 8:
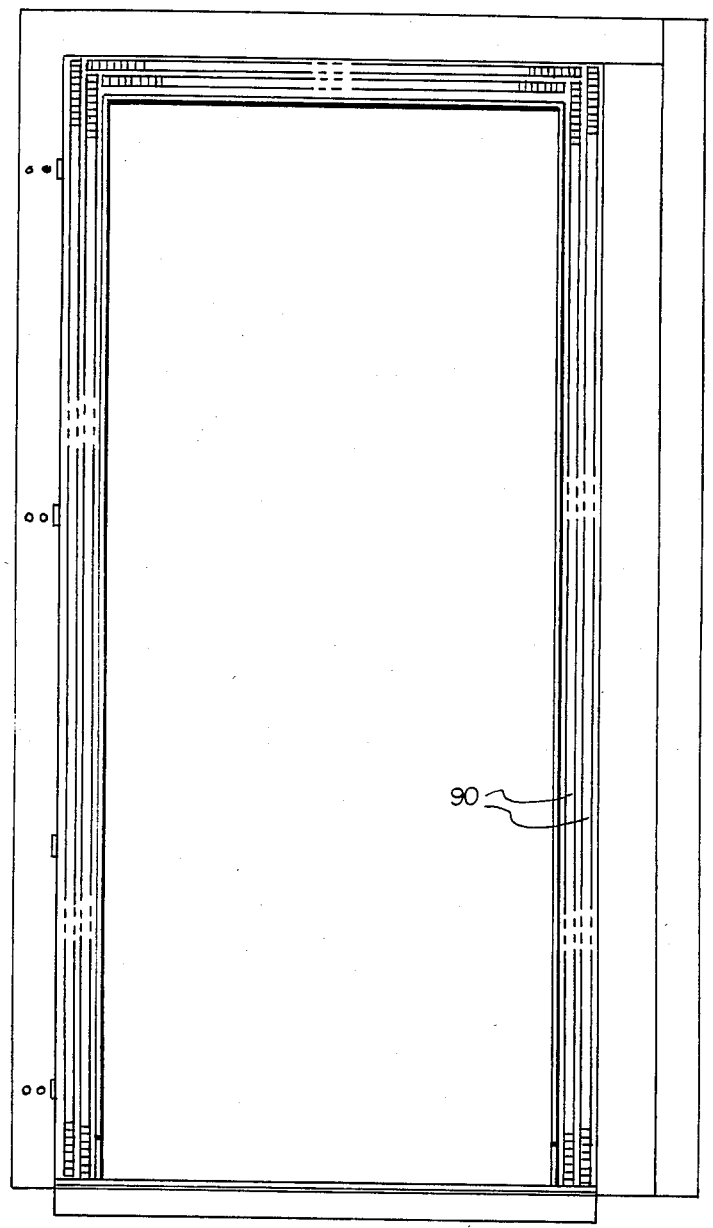
FIG. 8 is a front elevational view similar to that of FIG. 1 and with the door assembly removed; and, FIG. 9 is a fragmentary bottom plan view taken along the section 9—9 of FIG. 2 and viewed in the direction of the arrows.

As best shown in FIGS. 2 and 8, contact spring assemblies 90, which are similar to contact spring assemblies 82, are disposed along second edge 68 of tubular frame 32. The contact spring assemblies 90 are disposed in two parallel rows with the slots 88 between the individual clips being offset, as previously described. The contact springs 90 are arrayed along second edge 68 and thereby cooperate with the contact springs 82 to maintain electrical connection between the door D and the building B throughout the periphery thereof.

As best shown in FIG. 2, U-shaped clips 92 are secured in alignment to first frame 28 and door stop 62. Clips 92 are, preferably, of berrylium copper and are disposed in alignment in order to receive shunt member 94. Shunt member 94, which is also berrylium copper, has legs thereof adapted for being received within the U of the clips 92 and thereby serves to maintain electrical connection between the clips 92. The clips 92 and the shunt 94 are disposed forwardly of clips 90 and the shunt 94 thereby cooperates with the clips 90 to further prevent the transmission of field signals through opening 30. Additionally, shunt 94 keeps the clips 90 clean and improves the appearance of the frame 32. The legs of the shunt 94 are adapted to slide within the U of the clips 92 to thereby permit adjustment of the shunt in cooperation with adjustment of the door stop 62 and in cooperation with the opening of door D.

The shunt 94 is disposed forwardly of clips 90 in order to contact the tubular rim 46 when the door D is in the closed position, as best shown in FIG. 2. The engagement of the springs 90 with the door rim 46, in cooperation with shunt 94, is a compression pressure engagement. This pressure engagement causes each of the springs 90 to distort to some extent. The clips 90 are configured so to have two contact points with second edge 68. This serves to make sure that good electrical connection between the door rim 46 and the tubular frame 32 is maintained. One skilled in the art will appreciate that the compression of each of the springs 90 requires a small amount of force. Such a large number of springs 90 are provided, however, that a substantial force must be applied to the door D in order to properly seal the door D in the pocket 66. Consequently, the utilization of the clips 82 in sliding wiping engagement with the threshold 52 minimizes the opening and closing pressure necessary for the door D. It can be appreciated that the utilization of clips 82 in a manner similar to that of the spring assemblies 90 would necessitate the utilization of even higher closure pressures thereby greatly increasing the difficulty in closing or opening the door D.

As best shown in FIG. 3, panel 50 has an aperture 96 therethrough. Thrust bearing 98 is disposed in aperture 96 and is secured to panel 50 by bolts 100. Thrust bearing 98 has a central aperture 102 in which shaft 104 is rotatably disposed. It can be noted in FIG. 3 that panel member 50 has inner and outer generally parallel surfaces and that shaft 104 extends outwardly beyond each of the surfaces of the panel 50. Door D includes an inner decorative panel 106 and an outer decorative panel 108. Each of the decorative panels 106 and 108 has an aperture therethrough aligned with central aperture 102. Threaded washer 110 is disposed within aperture 112 of decorative panel 106 and threadedly engages the threaded portion 114 of shaft 104. Lock washer 116 is disposed inwardly of threaded washer 110 and similarly is threadedly engaged to threaded portion 114. An escutcheon clip 117 is disposed inwardly of lock washer 116 for decoratively finishing door D. Closure plate 118 is disposed forwardly of threaded washer 110 and needle bearings 120 cooperate therewith to facilitate rotation of shaft 104.

Thrust bearing 98 has an annular slot 122 in which needle bearings 124 are received. Slot 122 also contains a plurality of resilient contact spring assemblies 126, similar to contact springs 90, disposed around the inner and outer wall thereof. Closure plate 128 has a leg 130 thereof disposed within slot 122 and engaging each row of contacts 126 in order to prevent the transmission of field waves or signals through the aperture 96. Preferably, the spring assemblies 126 are similar to spring assemblies 82 and 90 and thereby maintain electrical connection between the shaft 104 and the door D. Handles 132 are mounted to the opposite ends of shaft 104 in order to permit rotation of shaft 104 so as to secure or unsecure the door D, as will be herein described.

As best shown in FIGS. 4–7, a first closure bell crank member 134 is mounted to shaft 104. Bell crank member 134 is triangularly shaped and is pivotable with shaft 104 such that rotation of handle 132 causes bell crank member 134 to pivot between its stops 136 and 138 which are secured to panel 50. First vertical link rod 140 is pivotally connected to one of the apexes of bell crank member 134. The vertical link rod extends longitudinally upwardly or downwardly along door D. A second bell crank member 142 is pivotally secured to the other end of vertical linkee 140 and to panel 50. A horizontal link rod 144 is pivotally secured to second bell crank 142. Latch bolt 146 is pivotally secured to the other end of horizontal link rod 144 and extends through apertures 148 and 150 and housing 152 in tubular rim 46. The apertures 148 and 150 are disposed forwardly of panel 50 so that any leakage of field signals will be prevented. Door rim 46, preferably, includes bearing housing 152 with Delrin ® or equal liner with snug fit inserted into apertures 148 and 150 in order to evenly transfer closing forces into rim 46 and door D and to prevent binding of the latch bolt 146.

Figure 5:
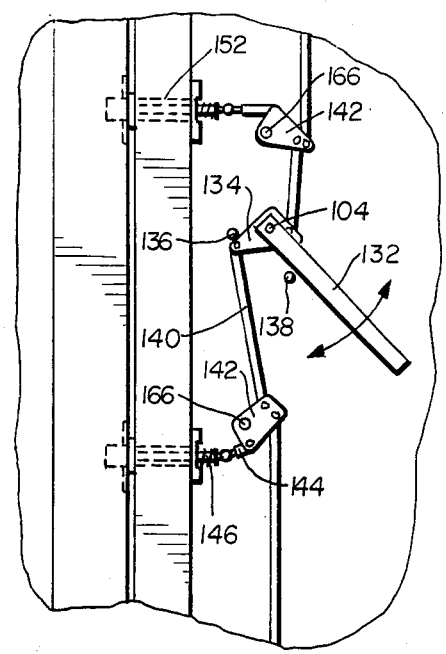
FIG. 5 is a fragmentary elevational view similar to that of FIG. 4 and with the locking assembly in the open configuration.
Figure 6:
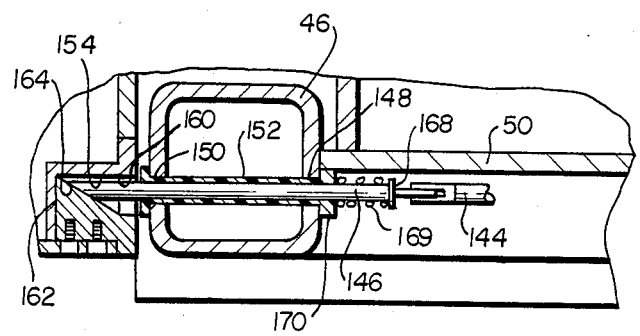
FIG. 6 is a fragmentary cross-sectional view taken along the section 6—6 of FIG. 4 viewed in the direction of the arrows.
Figure 7:
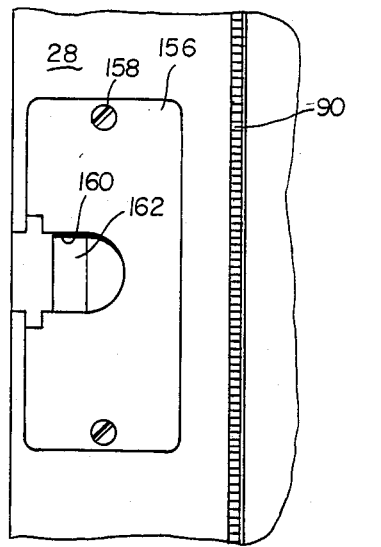
FIG. 7 is a fragmentary elevational view of the door frame of the invention disclosing the receiving means for the locking assembly.

As best shown in FIGS. 6 and 7, first frame 28 has an opening 154 therein aligned with the latch bolt 146. A cover plate 156 is secured by bolts 158 to first frame 28. Cover plate 156 includes contoured slot 160. A ramp member 162 extends angularly from slot 160 toward the opposite end thereof. The ramp 162 is, preferably, manufactured from oiled bronze which is a material having a low sliding friction coefficient. Each of the latch bolts 146 has an angled tapered end 164 which is aligned with the angled ramp 162 such that lateral displacement of the latch bolt 146 through the apertures 148 and 150 and bearing housing 152 causes the angled end 164 to slide along the ramp 162 and to thereby press against the rim member 46 to thereby close the door D. It can be noted in FIGS. 4 and 5 that a plurality of door closure members 140, 142, 144 and 146 are arrayed along one side of the door D and each of the closure assemblies has an aligned opening 154 as just described. It should be obvious that the closure mechanism could be provided on the opposite side of door D, or on both sides.

Figure 4:
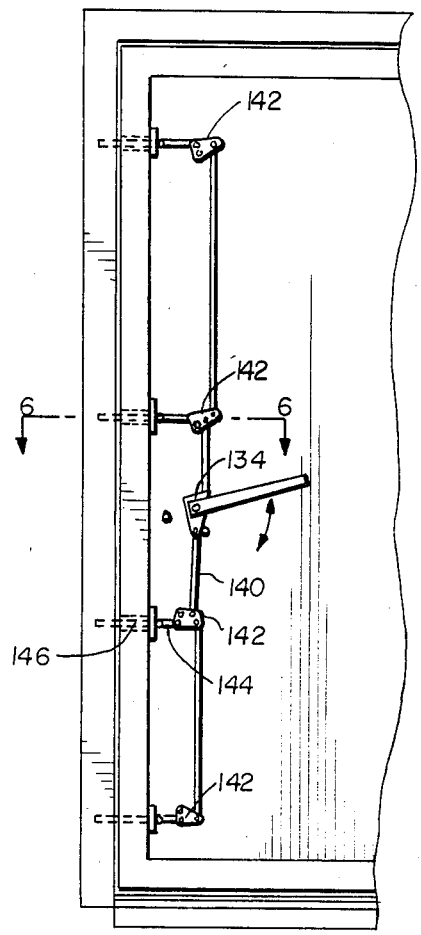
FIG. 4 is a fragmentary elevational view with the outer decorative panel removed and disclosing the locking assembly in the closed position.

The sliding action of the angled end 164 over the oiled bronze ramp 162 has the effect of causing the latch bolts 146 to press again the bearing housing 152 and the tubular rim 46. These forces move the door inwardly when the handle 132 is being rotated into the closed position, as best shown in FIG. 4. Because of the low friction characteristics of oiled bronze, the angled latch bolt end 164 continues to ride along the sloped surface until such time as the bell crank member 134 abutts stop 138. Testing has indicated that the combined effect of the four angled ends 164 of latch bolts 146 is such that while 20 lbs. of force are necessary to pivot the handle 132, this pivoting action is amplified so that 600–800 lbs. of closing force are generated. This closing force is sufficient to cause compression of the contact spring assemblies 90 to the extent that the electrical connection between the door D and the building B is always maintained when the door D is in the closed position. The amount of force required to pivot the handle 132 is well within the range required by local building regulations and yet is amplified to such an extent that the door D closes smoothly and easily while still causing compression of the spring assemblies 90.

FIG. 5 discloses the latch bolts 146 laterally displaced so as to be in the open position. The oiled bronze ramp 162 permits the outward lateral displacement of the latch bolts 146 and the resultant decompression of the spring assemblies 90 and 167 so that the door D is able to be easily opened in the event of an emergency situation.

As best shown in FIG. 6, each of the latch bolts 146 includes a shoulder 168 at the end opposite tapered end 164. A compression spring 169 is annularly mounted about shaft 146 between shoulder 168 and end 170 of housing 152. Spring 169 is compressed by displacement of latch bolt 146 into the latched position and retained compressed by shoulder 168. In the event of a failure of the latching system or of any of the horizontal link rods 144, then the spring 169 will retract the associated latch bolt 146. Consequently, the springs 169 provide a fail open position.

It can be noted in FIGS. 4 and 5 that each of the second bell crank members 142 is pivotally mounted on an axle 166 which maintains the latch bolts 146 in alignment with their respective apertures 148 and 150 and bearing housings 152. The axles 166 thereby cause lateral displacement of the latch bolts 146 and 144 horizontal link rods 144 upon cooperative rotation of the handle 132. It can also be noted that the second bell crank members 142 have a generally triangular configuration but that the configuration thereof may be altered to some extent in order to facilitate connection to an upper or lower vertical link rod 140.

The door assembly D and frame 32 are preferably coated with a rust inhibiting composition such as hot dipped zinc or the like. Such coatings are also conductive and thereby further assure good grounding of any signals while also preserving the aesthetic features and appearance of the door D.

While this invention has been described as having a preferred design, it is understood that it is capable of further modifications, uses and/or adaptations of the invention following in general the principle of the invention and including such departures from the present disclosure as come within known or customary practice in the art to which the invention pertains, and as may be applied to the central features herein before set for and fall within the scope of the invention of the limits of the appended claims.

What we claim is:

1. A shielded door assembly for a generally rectangular opening in the electrically conductive wall of a grounded building, comprising:
   (a) an electrically conductive first frame secured to said wall along three sides of said opening, said first frame in electrical connection with said wall;
   (b) an electrically conductive tubular frame secured to said first frame along the three sides thereof, said tubular frame in electrical connection with said first frame;
   (c) an electrically conductive threshold having a non-interrupted contact surface secured to said tubular frame at the remaining side of said opening, said threshold in electrical connection with said tubular frame;
   (d) an electrically conductive door stop secured to a first edge of said tubular frame and extending outwardly therefrom along the perimeter thereof generally parallel to said first frame and cooperating with said tubular frame and said first frame for defining a pocket;
   (e) said pocket includes a second edge of said tubular frame extending transverse of said first edge and providing a contact surface;
   (f) an electrically conductive tubular door rim pivotally secured to said first frame and adapted for pivoting between an open and a closed position, said door rim contiguous with at least said tubular frame when in said closed position;
   (g) an electrically conductive panel member secured to said door rim and in electrical connection therewith and therewith providing said door;
   (h) said door including a first surface thereof adjacent said threshold contact surface when in said closed position;
   (i) a plurality of electrically conductive resilient spring means secured to said first surface and in electrical connection therewith and adapted for sliding wiping engagement with said contact surface as said door pivots from said open to said closed position for thereby establishing electrical contact between said door and said contact surface;
   (j) said door frame including a second surface adjacent said second edge when said door is in said closed position;
   (k) a plurality of electrically conductive resilient spring means secured to one of said second surface and said second edge and in electrical connection therewith and adapted for non-sliding pressure contact with the other one of said second surface and said second edge for thereby establishing electrical connection therebetween;
   (l) electrically conductive means associated with one of said door stop and said door panel member engageable with the other one of said door stop and said door panel member for establishing electrical connection therebetween when said door is in said closed position; and (m) means associated with said door for maintaining said door in said closed position whereby said spring means of said first surface contacts said threshold and said spring means of said second surface and said second edge establishes electrical connection therebetween such that signals impinging on said door, said first frame and said tubular frame are conducted to said wall for thereby being grounded and substantially preventing passage thereof through said opening.

2. The assembly as defined in claim 1, wherein:
(a) said door first surface is substantially parallel to said contact surface.

3. The assembly as defined in claim 2, wherein:
(a) said door rim includes a tubular portion thereof adjacent said threshold and having a lower surface thereof providing said first surface; and,
(b) said door stop having aligned contoured recesses in a parallel two of said sides adapted for receipt therein of said tubular portion.

4. The assembly as defined in claim 3, wherein:
(a) a contoured clip member is removably secured to said tubular portion and has a portion thereof adapted for providing said first surface.

5. The assembly as defined in claim 1, wherein:
(a) said first edge includes means for adjusting said door stop whereby said door stop may be adjusted to thereby engage said electrically conductive means of said panel member continuously throughout said door stop length.

6. The assembly as defined in claim 1, wherein:
(a) said resilient spring means are secured to said second edge.

7. The assembly as defined in claim 6, wherein:
(a) electrical shunt means extend from said first frame to said door stop forwardly of said resilient spring means for thereby providing attenuation of fields impinging thereon.

8. The assembly as defined in claim 7, wherein:
(a) a pair of U-shaped electrically conductive members, each of said members mounted to one of said first frame and said door stop;
(b) said members disposed forwardly of said second edge and opening rearwardly thereto;
(c) said electrical shunt means includes an electrically conductive member having a pair of legs; and,
(d) each of said legs is displaceably disposed in one of said members for thereby permitting automatic adjustment of said shunt means.

9. The assembly as defined in claim 1, wherein:
(a) said means for maintaining said door includes a pivotable latch assembly connected to said panel member; and,
(b) said frame has latch receiving means whereby a portion of said latch assembly is pivotable to be received in said latch receiving means for thereby maintaining said door in said closed position.

10. The assembly as defined in claim 9, wherein:
(a) said panel member has an inner and an outer surface;
(b) an aperture is disposed in said panel member;
(c) a shaft is rotatably mounted in said aperture and has portions thereof extending beyond each of said inner and said outer surfaces;

(d) said latch portion is mounted to said shaft and rotatable therewith between an open and a received position; and,
(e) handle means are connected to each of said shaft portions and adapted for rotating said shaft for thereby pivoting said latch portion between said open and said latched positions.

11. The assembly as defined in claim 10, wherein:
(a) a bearing assembly is disposed in said aperture, said bearing assembly having an aperture therethrough;
(b) said shaft extends through said bearing assembly aperture; and,
(c) electrically conductive resilient spring means are coaxially disposed around said bearing assembly and are in electrical connection with said panel member for thereby preventing passage of said signals through said panel member aperture.

12. The assembly as defined in claim 11, wherein:
(a) a first bell crank member is secured to said portion extending beyond said outer surface and is pivotable therewith;
(b) at least a first vertical link rod is pivotally connected to said first bell crank member;
(c) a second bell crank member is pivotally secured to said outer surface and pivotally connected to said vertical link rod whereby pivoting of said first bell crank member causes associated pivoting of said second bell crank member; and,
(d) a horizontal link rod portion is pivotally connected to said second bell crank member.

13. The assembly as defined in claim 12, wherein:
(a) said horizontal link rod is pivotally connected to said second bell crank member; and,
(b) a latch bolt is pivotally connected to said horizontal link rod for providing said latch bolt portion whereby pivoting of said second bell crank member by pivoting of said first bell crank member causes lateral displacement of said latch bolt between said latched and said open positions.

14. The assembly as defined in claim 13, wherein:
(a) a contoured aperture is disposed in said frame and aligned with said latch bolt and is adapted for receiving a portion of said latch bolt therein for thereby providing said latch receiving means.

15. The assembly as defined in claim 14, wherein:
(a) a base plate is secured to said frame;
(b) said contoured aperture is disposed in said base plate;
(c) a bearing member is disposed in said frame and aligned with said contoured aperture; and,
(d) said latch bolt has a contact portion engageable with said bearing member and cooperating with said bearing member for thereby latching said door.

16. The assembly as defined in claim 15, wherein:
(a) said bearing member has a contact surface thereof angularly extending from said contoured aperture; and,
(b) said contact portion includes an angled portion thereof adapted for sliding on said surface whereby said latch bolt extends and bears against said contact surface of said contoured aperture for thereby closing and latching said door.

17. The assembly as defined in claim 16, wherein:
(a) said bearing member consists essentially of a low friction material for thereby facilitating sliding of said latch bolt thereon.

18. The assembly as defined in claim 12, wherein:
(a) stop means are associated with said outer surface adjacent said first bell crank member and are adapted for engaging said first bell crank member and preventing pivoting thereof after said member has pivoted a pre-determined amount.

19. The assembly as defined in claim 13, wherein:
(a) a second vertical link rod is pivotally connected to said second bell crank member and extends in a direction generally opposite to said first vertical link rod;
(b) a third bell crank member is pivotally secured to said panel member and to said second vertical link rod; and,
(c) a horizontal link rod is connected to said third bell crank member for providing said latch portion whereby pivoting of said second bell crank member causes lateral displacement of said horizontal link rod between said latched and said open positions.

20. The assembly as defined in claim 1, wherein:
(a) said resilient spring means connected in said pocket to said second edge of said tubular frame includes a plurality of spring members interconnected by tab portions whereby each of said spring members is longitudinally spaced from adjacent spring members by slots; and,
(b) said spring means are disposed in two generally parallel rows whereby said slots of said rows are offset for thereby assuring signal impingement on one of said spring members.

21. The assembly as defined in claim 1, wherein:
(a) said building includes an isolated portion thereof providing a floor;
(b) tube means secured in said floor contiguous with said threshold; and,
(c) said threshold is secured to one of said tube means, and said floor.

22. The assembly as defined in claim 21, wherein:
(a) a plurality of polypropylene pad members are disposed beneath and around said floor for thereby isolating said floor; and,
(b) said pad members are sealed together.

23. A shielded door assembly for a generally rectangular opening in the electrically conductive wall of a grounded building, comprising:
(a) an electrically conductive tubular frame secured to said wall along three sides of said opening, said frame in electrical connection with said wall;
(b) an electrically conductive threshold secured to said wall and said frame along the remaining side of said opening and in electrical connection with said wall and said frame;
(c) an electrically conductive door stop secured to a first edge of said frame and extending outwardly therefrom along the perimeter thereof and adapted for engaging and establishing electrical connection with a door closing said opening;
(d) a plurality of electrically conductive spring means are disposed about another edge of said frame transverse of said first edge, said spring means extend around the perimeter of said frame and are in electrical connection therewith;
(e) an electrically conductive tubular door rim is pivotally mounted to said frame and is adapted for pivoting between an open and a closed position;
(f) an electrically conductive door panel is secured to said door rim and is in electrical connection therewith and thereby provides a door for closing said opening, said door rim is adapted for engaging said spring means and said door stop is adapted for engaging said door panel through a spring shunt for thereby establishing electrical connection therebetween when said door is in said closed position;
(g) a plurality of electrically conductive resilient spring means are removably mounted to said door rim and are adapted for engaging said threshold and establishing electrical connection therewith when said door is in said closed position; and,
(h) locking means are associated with said door and are adapted for maintaining said door in said closed position whereby signals impinging on said door and said frame are conducted to said wall for thereby grounding said signals and preventing passage thereof through said opening.

* * * * *